United States Patent
Chen et al.

(10) Patent No.: US 10,694,634 B1
(45) Date of Patent: Jun. 23, 2020

(54) PICK-AND-PLACE DEVICE

(71) Applicants: Inventec (Pudong) Technology Corporation, Shanghai (CN); INVENTEC CORPORATION, Taipei (TW)

(72) Inventors: Po-Jui Chen, Taipei (TW); Ching-Yuan Liu, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 16/541,371

(22) Filed: Aug. 15, 2019

(30) Foreign Application Priority Data

Jun. 25, 2019 (CN) .......................... 2019 1 0556397

(51) Int. Cl.
| | |
|---|---|
| *H05K 7/14* | (2006.01) |
| *H05K 13/04* | (2006.01) |
| *B65G 47/91* | (2006.01) |
| *B65G 15/12* | (2006.01) |

(52) U.S. Cl.
CPC ........... *H05K 7/1402* (2013.01); *B65G 15/12* (2013.01); *B65G 47/91* (2013.01); *H05K 13/0406* (2018.08); *H05K 13/0413* (2013.01)

(58) Field of Classification Search
CPC ........ B65G 47/90; B65G 47/91; B65G 15/12; B65G 15/14; B65G 15/16; H05K 7/1402; H05K 13/041; H05K 13/0406; H05K 13/1413; H05K 13/0417; B25J 15/04; Y10T 29/53178; Y10T 29/53187; B23P 19/007

USPC ...................................... 198/681, 817, 465.4
See application file for complete search history.

(56) References Cited

U.S. PATENT DOCUMENTS

| | | | | |
|---|---|---|---|---|
| 5,894,648 | A * | 4/1999 | Hill ..................... | H05K 3/0052 29/33 P |
| 6,526,651 | B1 * | 3/2003 | Hwang .............. | H05K 13/0061 29/740 |
| 6,769,534 | B2 * | 8/2004 | Lee .................... | H05K 13/0061 198/817 |
| 9,120,383 | B2 * | 9/2015 | Jindo ................. | H05K 13/0406 |
| 10,368,447 | B2 * | 7/2019 | Yamamuro ........... | H05K 3/303 |

(Continued)

*Primary Examiner* — James R Bidwell
(74) *Attorney, Agent, or Firm* — Locke Lord LLP; Tim Tingkang Xia, Esq.

(57) ABSTRACT

This disclosure provides a pick-and-place device including base, carrying mechanism, driving mechanism and clamping mechanism. Carrying mechanism includes first side part, second side part, two conveyor assemblies and two first driving devices. Conveyor assemblies are respectively disposed on first side part and second side part and configured to carry circuit board. First driving devices are respectively connected to conveyor assemblies so as to respectively turn conveyor assemblies. Driving mechanism is disposed on base. Clamping mechanism includes base plate, clamping assembly and second driving device. Base plate is movably disposed on base via driving mechanism. Clamping assembly includes first claw and second claw are disposed on base plate and configured to pick and place circuit board. Second driving device is disposed on base plate. Second driving device is connected to clamping assembly so as to move first claw and second claw toward or away from each other.

10 Claims, 8 Drawing Sheets

(56) References Cited

U.S. PATENT DOCUMENTS

| | | | |
|---|---|---|---|
| 2003/0066734 A1* | 4/2003 | Prentice | B65G 21/10 |
| | | | 198/346.1 |
| 2005/0133346 A1* | 6/2005 | Kabeshita | H05K 13/0061 |
| | | | 198/817 |
| 2008/0092680 A1* | 4/2008 | Kim | H01L 21/67748 |
| | | | 74/89.31 |
| 2015/0128856 A1* | 5/2015 | Doyle | H01L 21/6715 |
| | | | 118/503 |
| 2019/0176256 A1* | 6/2019 | Otsubo | H05K 3/34 |
| 2019/0350112 A1* | 11/2019 | Yamada | H05K 13/0409 |
| 2020/0105566 A1* | 4/2020 | Huska | H01L 21/67265 |

* cited by examiner

PICK-AND-PLACE DEVICE

CROSS-REFERENCE TO RELATED APPLICATIONS

This non-provisional application claims priority under 35 U.S.C. § 119(a) on Patent Application No(s). 201910556397.5 filed in China, on Jun. 25, 2019, the entire contents of which are hereby incorporated by reference.

BACKGROUND OF THE INVENTION

Technical Field of the Invention

The disclosure relates to a pick-and-place device, more particularly to a pick-and-place device configured to pick and place a circuit board.

Description of the Related Art

In general, a pick-and-place device for picking and placing a circuit board may include a carrying mechanism and one or more vacuum suction mechanism. The vacuum suction mechanism can suck the circuit board on the carrying mechanism, and then the circuit board can be placed in place when the suction mechanism releases it.

SUMMARY OF THE INVENTION

One embodiment of this disclosure provides a pick-and-place device, configured to pick and place a circuit board and including a base, a carrying mechanism, a driving mechanism and a clamping mechanism. The carrying mechanism includes a first side part, a second side part, two conveyor assemblies and two first driving devices. The first side part is disposed on the base. The second side part is disposed on the base and located opposite to the first side part. The two conveyor assemblies are respectively disposed on the first side part and the second side part and configured to carry the circuit board. The two first driving devices are respectively connected to the two conveyor assemblies so as to be configured to respectively turn the two conveyor assemblies. The driving mechanism is disposed on the base. The clamping mechanism includes a base plate, a clamping assembly and a second driving device. The base plate is movably disposed on the base via the driving mechanism. The clamping assembly includes a first claw and a second claw. The first claw and the second claw are disposed on the base plate and are configured to pick and place the circuit board. The second driving device is disposed on the base plate. The second driving device is connected to the clamping assembly so as to move the first claw and the second claw toward or away from each other.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1:
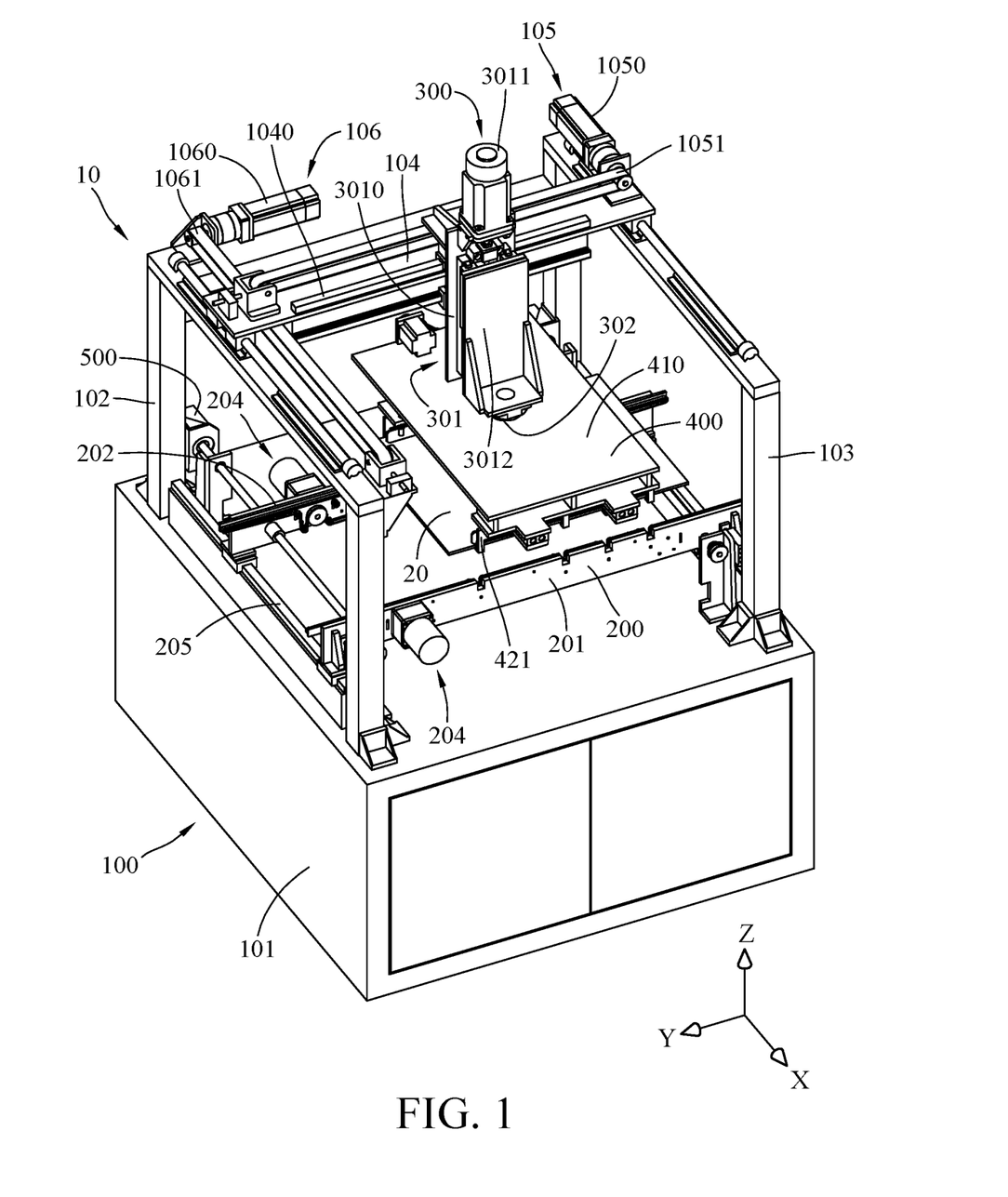
FIG. 1 is a perspective view of a pick-and-place device according to an embodiment of the disclosure with a circuit board.

Please refer to FIG. 1. FIG. 1 is a perspective view of a pick-and-place device 10 according to an embodiment of the disclosure with a circuit board 20. It is noted that Cartesian coordinate systems consist of axis X, Y and Z are shown in some of the drawings for the purpose of illustration, but the disclosure is not limited thereto.

As shown in the figure, the pick-and-place device 10 is able to pick up the circuit board 20, carry and place it to a desired location. In this embodiment, the pick-and-place device 10 includes a base 100, a carrying mechanism 200, a driving mechanism 300 and a clamping mechanism 400.

The base 100 may include a bottom part 101, two side frame parts 102 and 103, a slidable part 104 and two driving devices 105 and 106. The two side frame parts 102 and 103 stand on the bottom part 101 and are located opposite to each other. The slidable part 104 is slidably disposed on the side frame parts 102 and 103. The driving device 105 includes a driving unit 1050 and a belt 1051. The driving unit 1050 is, for example, a motor, but the type of such motor is not particularly limited. The belt 1051 is looped over a drive shaft (not labeled) of the driving unit 1050 and a pulley (not labeled) pivotally disposed on the slidable part 104. The driving device 106 includes a driving unit 1060 and a belt 1061. The driving unit 1060 is, for example, a motor, but the type of such motor is not particularly limited. The belt 1061 is looped over a drive shaft (not labeled) of the driving unit 1060 and a pulley (not labeled) pivotally disposed on the side frame part 103. The upper part of the belt 1061 is fixed to the bottom side of the slidable part 104 by, for example, screwing, adhering, or other suitable manners. Therefore, as the driving unit 1060 is turned on, the driving unit 1060 turns the belt 1061 so as to move the slidable part 104 along the side frame part 130 (e.g., along the axis X).

Figure 2:
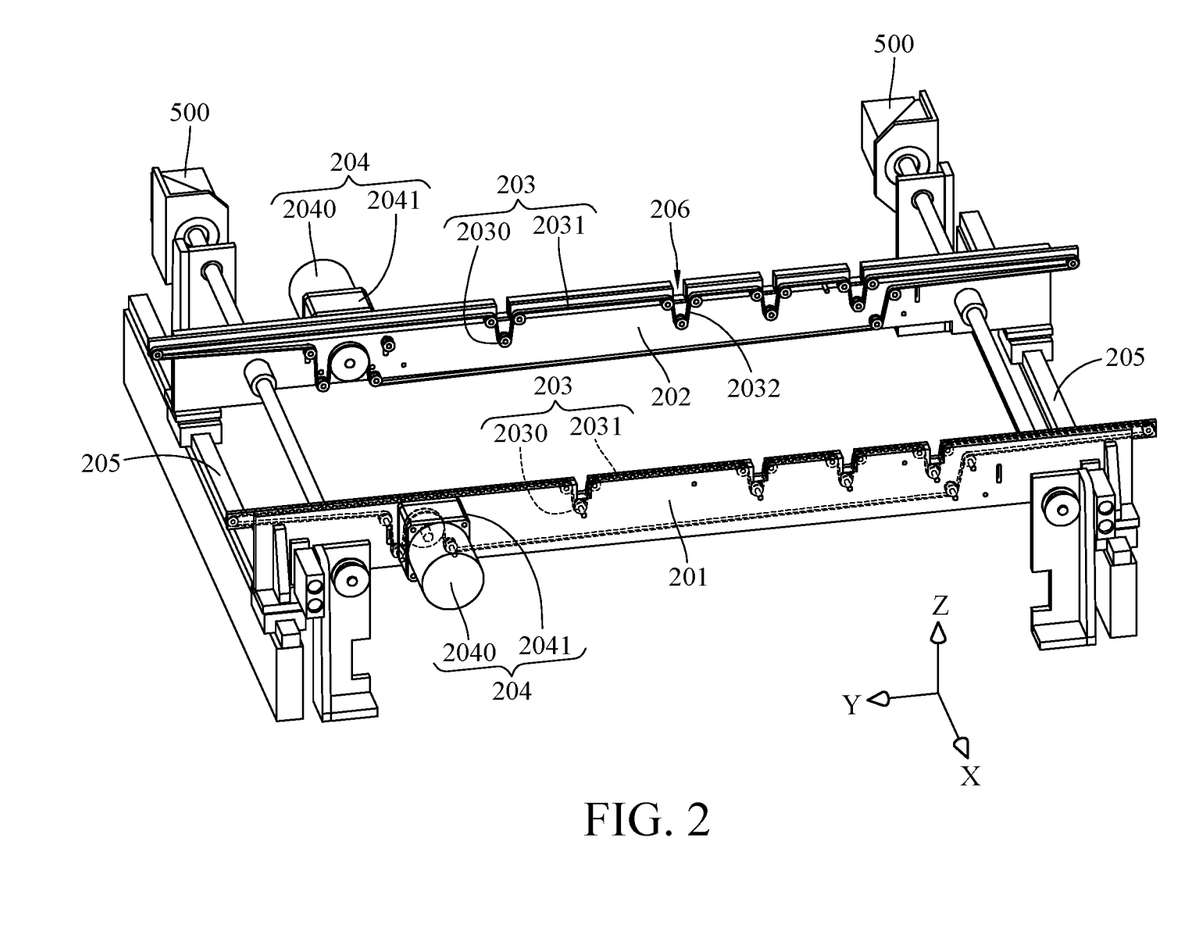
FIG. 2 is a perspective view of a carrying mechanism and a third driving device of the pick-and-place device in FIG. 1.

Please refer to FIG. 1 and further refer to FIG. 2, where FIG. 2 is a perspective view of a carrying mechanism and a third driving device of the pick-and-place device in FIG. 1.

In this embodiment, the carrying mechanism 200 may include two slide rails 205, a first side part 201, a second side part 202, two conveyor assemblies 203 and two first driving devices 204. The two slide rails 205 are disposed on the bottom part 101 and located opposite to each other. The first side part 201 and the second side part 202 are slidably disposed on the slide rails 205 and are spaced apart from each other. In addition, the first side part 201 and the second side part 202 may each have a plurality of recesses 206.

The conveyor assemblies 203 are respectively disposed on the first side part 201 and the second side part 202. Each conveyor assembly 203 may include a plurality of pulleys 2030 and a conveyor belt 2031, where pulleys 2030 are respectively disposed on the first side part 201 and the second side part 202, and the conveyor belt 2031 is looped over the pulleys 2030 such that the conveyor belt 2031 form a plurality of curved parts 2032 respectively corresponding to the recesses 206. The conveyor belts 2031 are configured to support and transport the circuit board 20.

Each first driving device 204 may include a driving unit 2040 and a gear reducer 2041 that are connected to each other. The driving unit 2040 is, for example, a motor, but the type of such motor is not particularly limited. On the first side part 201 and the second side part 202, there is a driven pulley (not labeled) connected to the gear reducer 2041 and the conveyor belt 2031 is also looped over the driven pulley, such that the driving units 2040 is able to turns the conveyor belt 2031 and the pulleys 2030 by driving the gear reducer 2041.

In this embodiment, the pick-and-place device 10 further includes two third driving devices 500. The third driving device 500 includes a driving unit (not labeled) and a screw rod (not labeled), where the driving unit is disposed on the base 100 and is, for example, a motor, but the type of such motor is not particularly limited, and the screw rod is connected to the driving unit and screwed into the second side part 202 and can be rotated by the driving unit so that the driving unit is able to move the second side part 202 toward or away from the first side part 201 by rotating the screw rod. As such, the distance between the first side part 201 and the second side part 202 can be adjusted so as to fit the size of the circuit board 20. It is noted that, for the purpose of simple illustration, the threads of the screw rod of the driving device 500 may be omitted. In addition, the third driving devices 500 are optional; in other embodiments, the pick-and-place device may not include the third driving device, in such a case, the distance between the first and second side frame parts can be adjusted in a manual manner.

The driving mechanism 300 may include a first movable mechanism 301 and a second movable mechanism 302. The first movable mechanism 301 includes a first plate 3010, a driving unit 3011, a screw rod (not labeled) and a second plate 3012, where the first plate 3010 is slidably disposed on a slide rail 1040 of the slidable part 104, the driving unit 3011 is disposed on the first plate 3010, the screw rod is screwed into the second plate 3012 and is connected to the driving unit 3011 and can be rotated by the driving unit 3011, such that the driving unit 3011 is able to move the second plate 3012 along the first plate 3010, for example, along the axis Z. In addition, the upper part of the belt 1051 is fixed to first plate 3010 so that the driving unit 1050 can move the first plate 3010 along the slidable part 104 via the slide rail 1040, for example, along an axis Y. The driving mechanism 300 may further include a driving unit (not labeled) disposed in the second plate 3012, and the second movable mechanism 302 is fixed on a drive shaft of the driving unit so that the driving unit is able to rotate the second movable mechanism 302 relative to the second plate 3012, for example, along the axis Z.

Figure 3:
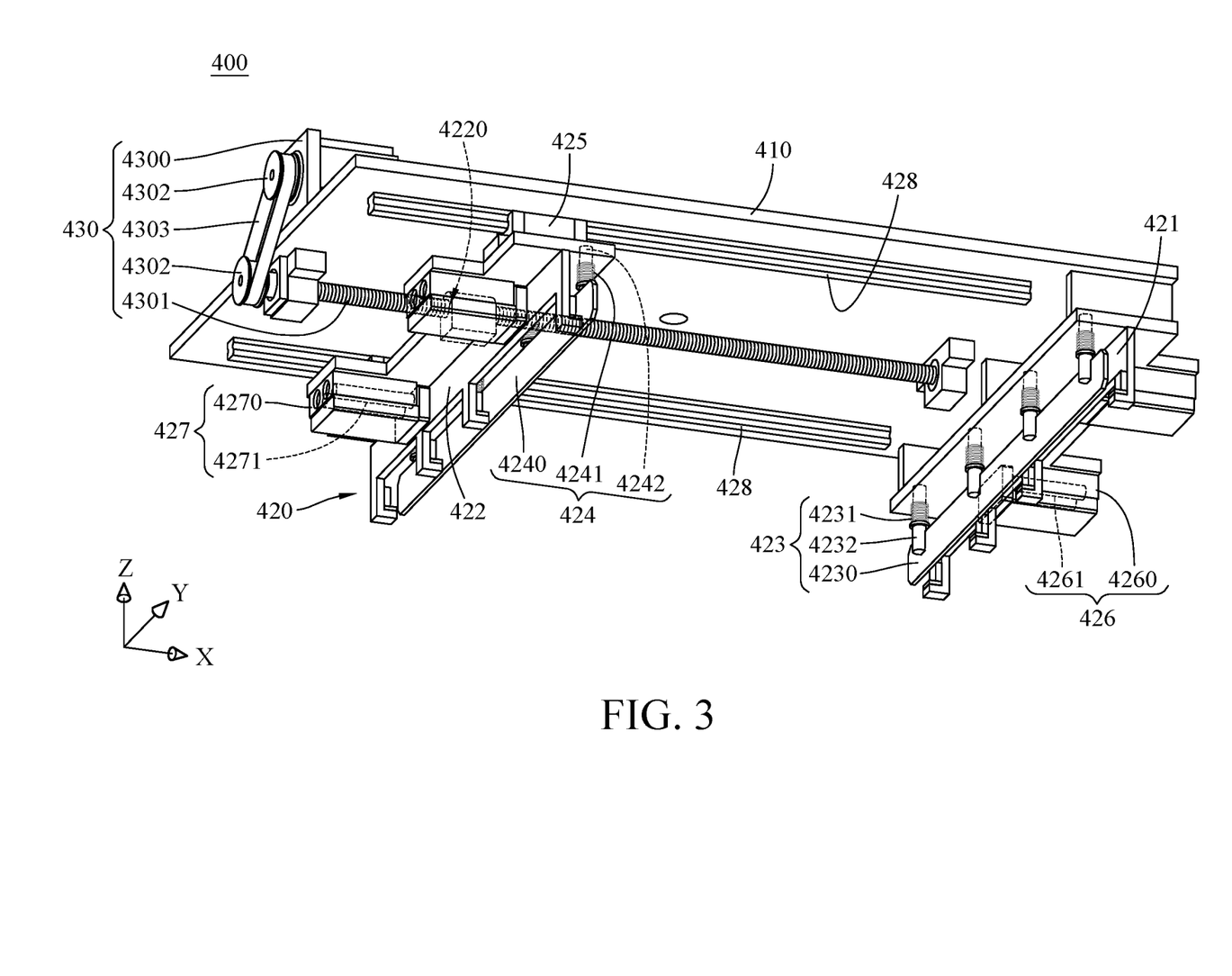
FIG. 3 is a perspective view of a clamping mechanism of the pick-and-place device in FIG. 1.
Figure 4:
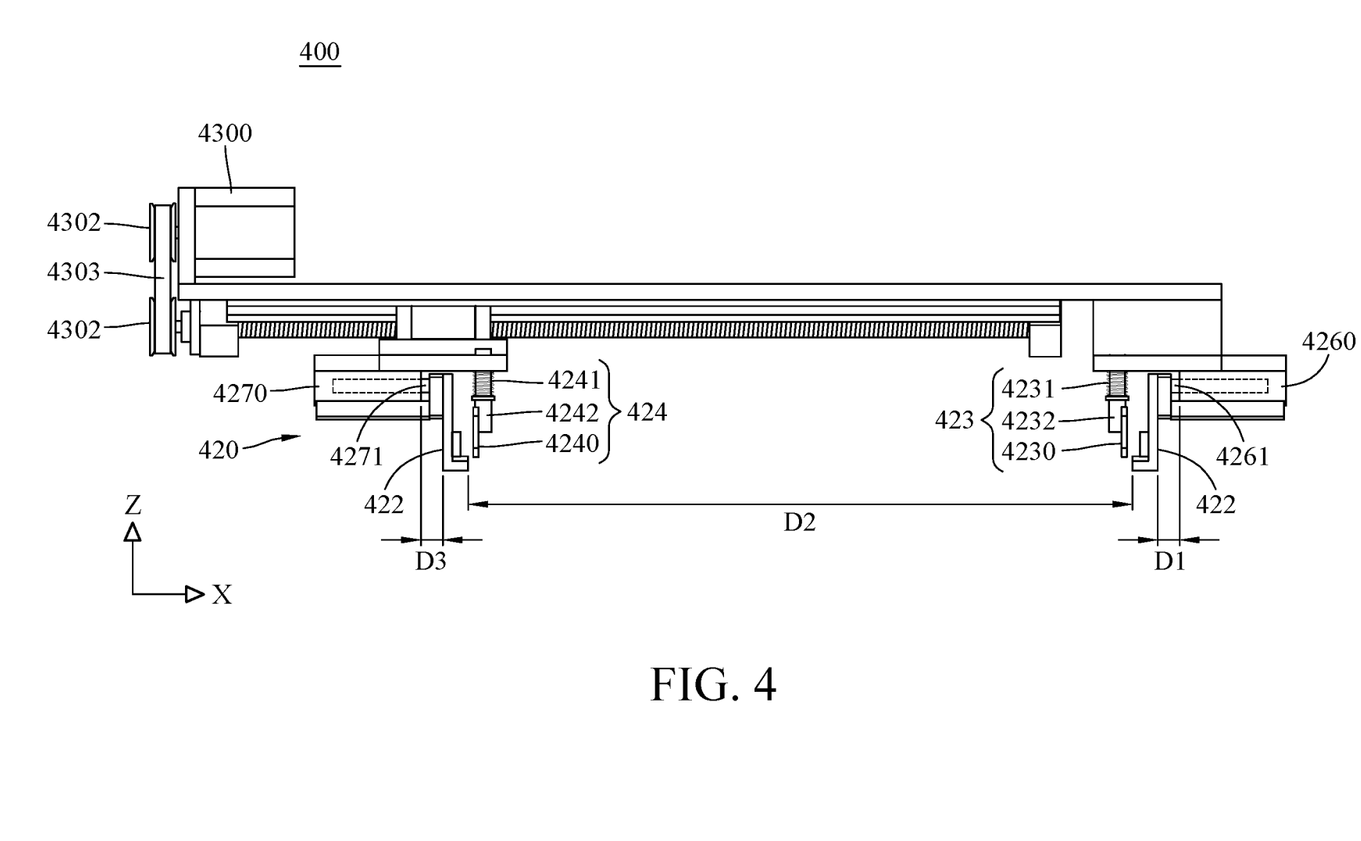
FIG. 4 is a side view of the clamping mechanism in FIG. 3.

Referring to FIG. 1 and further referring to FIG. 3 and FIG. 4, FIG. 3 is a perspective view of a clamping mechanism of the pick-and-place device in FIG. 1, and FIG. 4 is a side view of the clamping mechanism in FIG. 3.

The clamping mechanism 400 includes a base plate 410, a clamping assembly 420 and a second driving device 430.

The base plate 410 is fixed on the second movable mechanism 302. Therefore, with the help of the driving devices 105 and 106, the slidable part 104 and the driving mechanism 300, the base plate 410 can be moved along the axis X, Y and Z, and can be rotated about the axis Z.

The clamping assembly 420 may include a first claw 421, a second claw 422, a first fixing assembly 423, a second fixing assembly 424, two movable components 425, two first adjustment devices 426 and two second adjustment devices 427.

The first claw 421 and the second claw 422 are disposed on the base plate 410, where the second claw 422 is slidably disposed on the base plate 410 so as to be moved toward or away from the first claw 421.

The first fixing assembly 423 may include a first press component 4230, a plurality of first elastic biasing members 4231 and a plurality of first pillar pieces 4232. Two opposite ends of the first pillar piece 4232 are respectively movably inserted into the base plate 410 and fixed to the first press component 4230, and the first elastic biasing member 4231 is sleeved on the first pillar piece 4232 and located between the base plate 410 and the first press component 4230, such that two opposite ends of the first elastic biasing member 4231 respectively press against the first press component 4230 and the base plate 410. The first press component 4230 is movably disposed on the base plate 410 via the first elastic biasing members 4231 and the first pillar pieces 4232.

The second fixing assembly 424 may include a second press component 4240, a plurality of second elastic biasing members 4241 and a plurality of second pillar pieces 4242. Two opposite ends of the second pillar piece 4242 are respectively movably inserted into the base plate 410 and fixed to the second press component 4240, and the second elastic biasing member 4241 is sleeved on the second pillar pieces 4242, such that two opposite ends of the second elastic biasing member 4241 respectively press against the second press component 4240 and the base plate 410. The second press component 4240 is movably disposed on the base plate 410 via the second elastic biasing members 4241 and the second pillar pieces 4242.

The quantities of the first elastic biasing members 4231 and that of the second elastic biasing members 4241 are not particularly limited; in other embodiments, the first fixing assembly may have one first elastic biasing member and the second fixing assembly may have one second elastic biasing member.

In addition, the first pillar pieces 4232 and the second pillar pieces 4242 are optional; in other embodiments, the first fixing assembly and the second fixing assembly may not include the first pillar piece and the second pillar piece, and the first press component and the second press component can be movably disposed on the base plate respectively directly via the first elastic biasing member and the second elastic biasing member.

There are two slide rails 428 disposed on the base plate 410 and spaced apart from each other. The two movable components 425 are respectively slidably disposed on the slide rails 428. The second claw 422 are fixed to the movable components 425 so that the second claw 422 is slidably disposed on the slide rails 428 via the two movable components 425.

Note that the quantity of the movable components 425 is not particularly limited; in other embodiments, the clamping assembly may only include one movable component, in such a case, there may only be one slide rail disposed on the base plate of the clamping mechanism. In addition, besides the movable components and the slide rails, the second claw can be slidably disposed on the base plate of the clamping mechanism in another manner. For example, in still other embodiments, the second claw can have a gear movably engaged with a rack gear on the base plate.

The first adjustment devices 426 are, for example, telescopic cylinders and each may include a first driving unit 4260 and a first telescopic part 4261, where the first driving unit 4260 is fixed on the base plate 410, the first telescopic part 4261 is movably disposed on the first driving unit 4260 and can be moved by the first driving unit 4260, and the first claw 421 is fixed to the first telescopic part 4261. Therefore, the first driving units 4260 are able to move the first telescopic parts 4261 so as to move the first claw 421 and thus adjusting a distance D1 between the first claw 421 and the first driving units 4260, thereby adjusting a distance D2 between the first claw 421 and the second claw 422.

The two second adjustment devices 427 are, for example, telescopic cylinders and each may include a second driving unit 4270 and a second telescopic part 4271, where the second driving unit 4270 is fixed on the base plate 410, the second telescopic part 4271 is movably disposed on the second driving unit 4270 and can be moved by the second driving unit 4270, and the second claw 422 is fixed to the second telescopic part 4271. Therefore, the second driving units 4270 are able to move the second telescopic parts 4271 so as to move the second claw 422 and thus adjusting a distance D3 between the second claw 422 and the second driving units 4270, thereby adjusting the distance D2 between the first claw 421 and the second claw 422.

Note that the quantity of the first adjustment devices 426 and that of the second adjustment devices 427 are not particularly limited. In other embodiments, the clamping assembly may also include one first adjustment device and one second adjustment device.

The second driving device 430 may include a driving unit 4300, such as any suitable type of motor, a threaded rod 4301, two pulleys 4302 and a belt 4303. The driving unit 4300 is disposed on the base plate 410. The threaded rod 4301 is screwed through a screw hole 4220 of the second claw 422. One of the pulleys 4302 is disposed on the driving unit 4300 and can be rotated by the driving unit 4300, and the other pulley 4302 is fixed on an end of the threaded rod 4301. The belt 4303 is looped over the pulleys 4302. Therefore, as the driving unit 4300 is turned on, the driving unit 4300 is able to turn the pulleys 4302, the belt 4303 and the threaded rod 4301 to move the second claw 422 toward or away from the first claw 421 along the slide rails 428. By doing so, the distance D2 between the first claw 421 and the second claw 422 can be adjusted to be a suitable amount that allows the first claw 421 and the second claw 422 to press against the circuit board 20. Comparing to the first adjustment devices 426 and the second adjustment devices 427, the threaded rod 4301 permits a larger distance variation between the first claw 421 and the second claw 422 (i.e., the distance D2), so the first adjustment devices 426 and the second adjustment devices 427 are suitable to slightly adjust the distance D2, and the threaded rod 4301 is suitable to significantly adjust the distance D2.

Furthermore, the first adjustment devices 426 and the second adjustment devices 427 are optional. In other embodiments, the clamping assembly may not include the first adjustment device and the second adjustment device, and the distance between the first claw and the second claw is adjusted merely by the second driving device.

Figure 5:
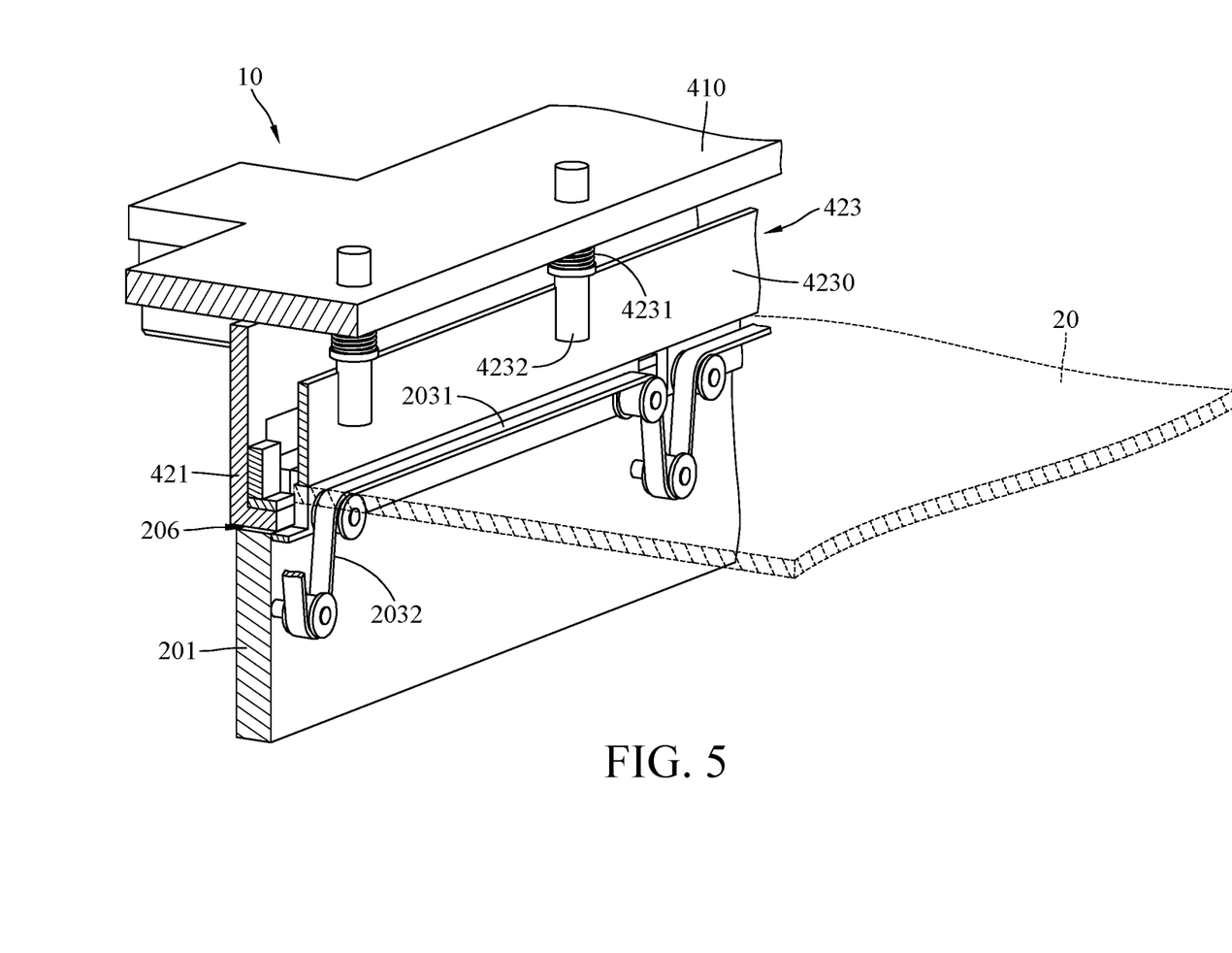
FIG. 5 illustrates a perspective and partially enlarged cross-sectional view of the pick-and-place device showing that the circuit board is clamped by the first press component and the conveyor belt.
Figure 6:
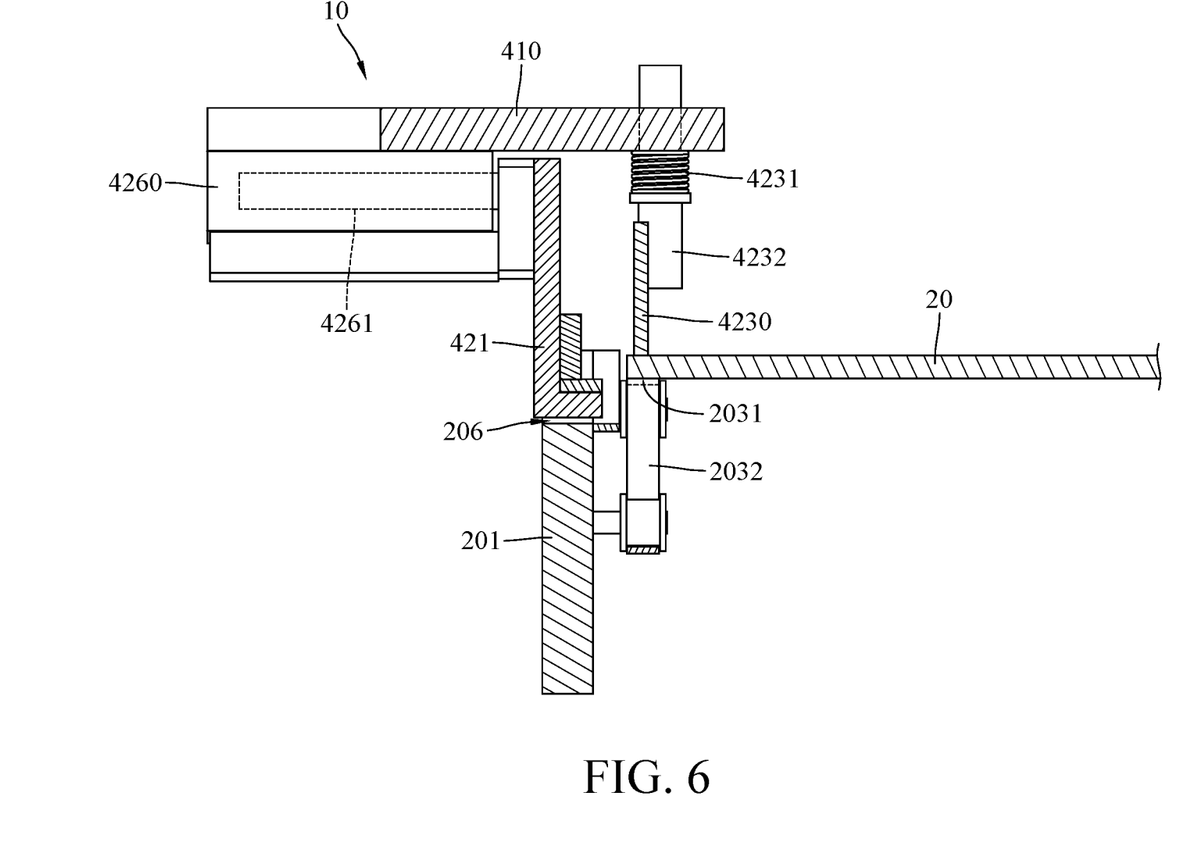
FIG. 6 illustrates a side and partially enlarged cross-sectional view of the pick-and-place device showing that the circuit board is clamped by the first press component and the conveyor belt.
Figure 7:
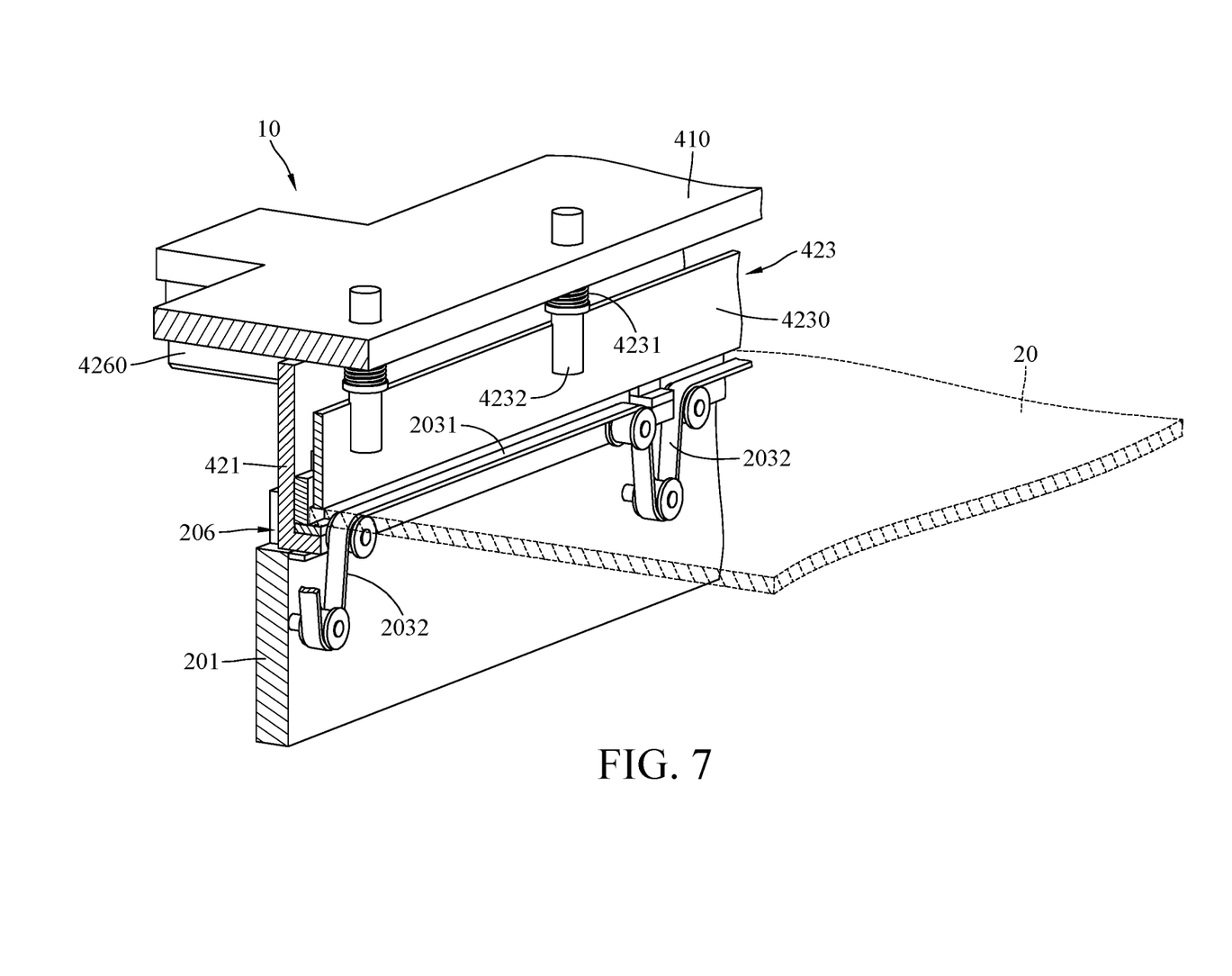
FIG. 7 illustrates a perspective and partially enlarged cross-sectional view of the pick-and-place device showing that a first claw passes through a space formed by a curved part of the conveyor belt and the circuit board is clamped by the first claw and the first press component.
Figure 8:
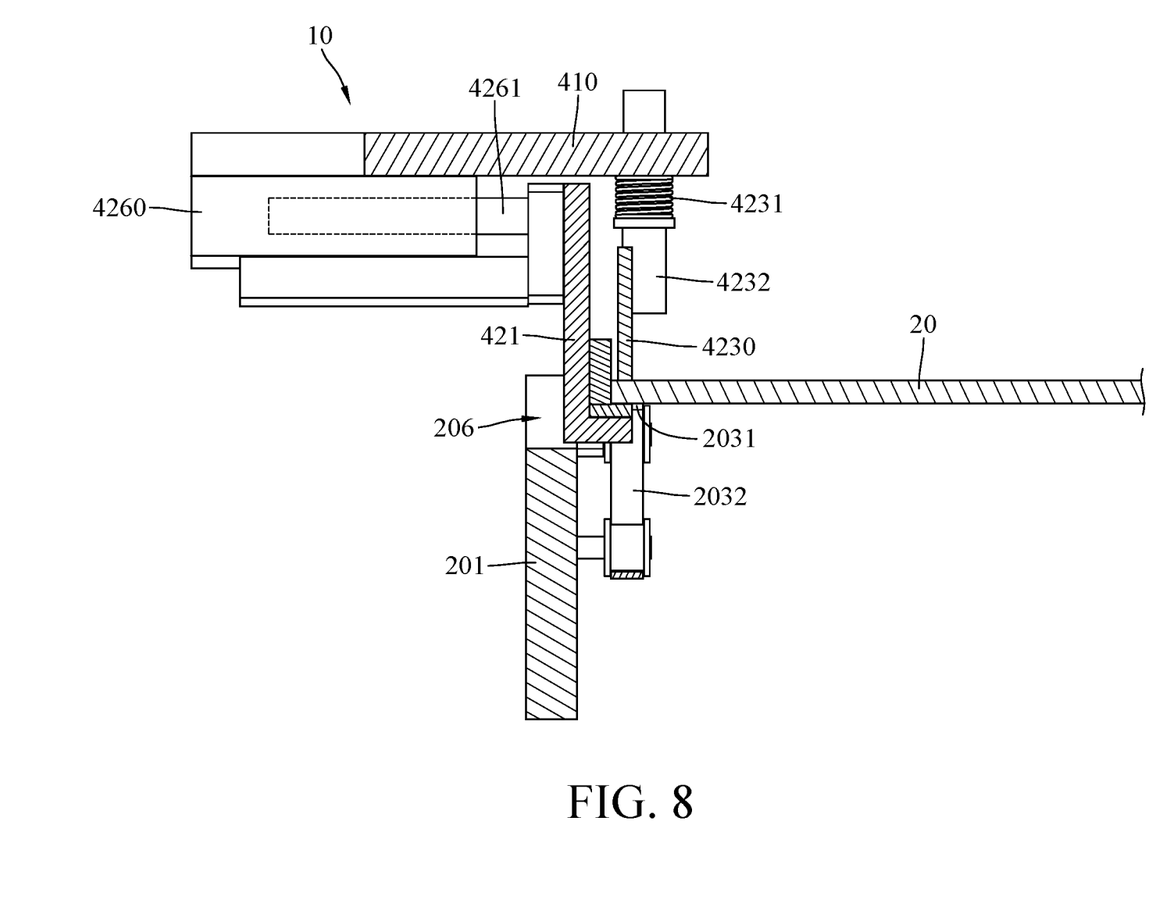
FIG. 8 illustrates a side and partially enlarged cross-sectional view of the pick-and-place device showing that a first claw passes through a space formed by a curved part of the conveyor belt and the circuit board is clamped by the first claw and the first press component.

As the third driving device 500 spaces the first and second side parts 201 and 202 at a suitable distance for the conveyor belts 2031 to support the circuit board 20, and the second driving device 430 moves the second press component 4240 to a suitable location that permits the first and second press component 4230 and 4240 to press against the circuit board 20, the clamping mechanism 400 may start to pick up the circuit board 20. In detail, please refer to FIG. 1 and FIG. 5 to FIG. 8. FIG. 5 illustrates a perspective and partially enlarged cross-sectional view of the pick-and-place device 10 showing that the circuit board 20 is clamped by the first press component 4230 and the conveyor belt 2031. FIG. 6 illustrates a side and partially enlarged cross-sectional view of the pick-and-place device 10 showing that the circuit board 20 is clamped by the first press component 4230 and the conveyor belt 2031. FIG. 7 illustrates a perspective and partially enlarged cross-sectional view of the pick-and-place device 10 showing that a first claw 421 passes through a space formed by a curved part 2032 of the conveyor belt 2031 and the circuit board 20 is clamped by the first claw 421 and the first press component 4230. FIG. 8 illustrates a side and partially enlarged cross-sectional view of the pick-and-place device 10 showing that a first claw 421 passes through a space formed by a curved part 2032 of the conveyor belt 2031 and the circuit board 20 is clamped by the first claw 421 and the first press component 4230.

The movement of the second claw 422 and the second press component 4240 to clamp the circuit board 20 may be similar to that of the first claw 421 and the first press component 4230, so the drawings only illustrate one side of the pick-and-place device 10. Firstly, as shown in FIG. 5 and FIG. 6, the first press component 4230 of the first fixing assembly 423 presses the circuit board 20 placed on the conveyor belt 2031, and the first elastic biasing member 4231 of the first fixing assembly 423 is compressed by the base plate 410 and the first pillar piece 4232 so as to exert elastic force on the first press component 4230 via the first pillar piece 4232, such that the circuit board 20 can be firmly clamped by the first press component 4230 and the conveyor belt 2031.

Next, as shown in FIG. 7 and FIG. 8, when the first driving unit 4260 drives the first telescopic part 4261 to push the first claw 421 away from the first driving unit 4260, the first claw 421 passes through the recesses 206 of the first side part 201 and the space formed by the curved part 2032 of the conveyor belt 2031. At this moment, the first claw 421 supports the circuit board 20 so that the circuit board 20 is also clamped by the first claw 421 and the first press component 4230. Then, the circuit board 20 is ready to be picked up and moved by the clamping mechanism 400. As discussed above, with the cooperation of the driving devices 105 and 106, the slidable part 104 and the driving mechanism 300 it is understood that the circuit board 20 can be moved to a desired position. The operation for releasing the circuit board 20 can be simply performed by reversing the above steps, so the descriptions thereof are omitted.

Moreover, the recesses 206 and the curved parts 2032 are optional. In other embodiments, the first side part and the second side part may not have the recesses and the conveyor belts may not have the curved parts, and the distance between the first side part and the second side part may be reduced and the circuit board may be located above the first side part and the second side part, such that the first side part and the second side part are located between the first claw and the second claw during the operation for picking the circuit board.

Furthermore, the first fixing assembly 423 and the second fixing assembly 424 are optional; in other embodiments, the clamping assembly may not include the first fixing assembly and the second fixing assembly, and the circuit board may be fixed in an engagement holes of the first claw and the second claw.

According to the pick-and-place device discussed above, the second driving device is able to move the first claw or the second claw to adjust the distance between the first claw and the second claw, so the first and the second claws can stably clamp circuit boards of various sizes.

In addition, the first claw and the second claw can lift a bigger plate that allows multiple circuit boards to be placed thereon. Therefore, the pick and place device can stably pick or place multiple circuit boards, thereby further improving the flexibility for the pick-and-place device to pick and place the circuit board.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A pick-and-place device, configured to pick and place a circuit board, the pick-and-place device comprising:
   a base;
   a carrying mechanism, comprising:
      a first side part, disposed on the base;
      a second side part, disposed on the base and located opposite to the first side part;
      two conveyor assemblies, respectively disposed on the first side part and the second side part and configured to carry the circuit board; and
      two first driving devices, respectively connected to the two conveyor assemblies so as to be configured to respectively turn the two conveyor assemblies;
   a driving mechanism, disposed on the base; and
   a clamping mechanism, comprising:
      a base plate, movably disposed on the base via the driving mechanism;
      a clamping assembly, comprising a first claw and a second claw, wherein the first claw and the second claw are disposed on the base plate and are configured to pick and place the circuit board; and
      a second driving device, disposed on the base plate, wherein the second driving device is connected to the clamping assembly so as to move the first claw and the second claw toward or away from each other.

2. The pick-and-place device according to claim 1, wherein the clamping assembly further comprises:
   a first fixing assembly comprising a first press component and at least one first elastic biasing member, two opposite ends of the at least one first elastic biasing member respectively press against the first press component and the base plate, such that the first press component is movably disposed on the base plate via the at least one first elastic biasing member; and
   a second fixing assembly comprising a second press component and at least one second elastic biasing member, two opposite ends of the at least one second elastic biasing member respectively press against the second press component and the base plate, such that the second press component is movably disposed on the base plate via the at least one second elastic biasing member.

3. The pick-and-place device according to claim 2, wherein:
   the first fixing assembly further comprises a plurality of first pillar pieces, in each of the plurality of first pillar pieces, two opposite ends of the first pillar piece are respectively movably inserted into the base plate and fixed to the first press component, a quantity of the at least one first elastic biasing member is plural, and the plurality of the first elastic biasing members are respectively sleeved on the plurality of first pillar pieces; and
   the second fixing assembly further comprises a plurality of second pillar pieces, in each of the plurality of second pillar pieces, two opposite ends of the second pillar piece are respectively inserted into the base plate and fixed on the second press component, a quantity of the at least one second elastic biasing member is plural, and the plurality of second elastic biasing members are respectively sleeved on the plurality of second pillar pieces.

4. The pick-and-place device according to claim 1, wherein the first side part and the second side part each have a plurality of recesses, the two conveyor assemblies each include a plurality of pulleys and a conveyor belt, in each of the two conveyor assemblies, the conveyor belt is looped over the plurality of pulleys so that the conveyor belt forms a plurality of curved parts respectively corresponding to the plurality of recesses, the plurality of pulleys of the two conveyor assemblies are respectively disposed on the first side part and the second side part, the two first driving devices are respectively connected to the plurality of pulleys of the two conveyor assemblies, and the two conveyor belts are configured to support and transport the circuit board.

5. The pick-and-place device according to claim 1, wherein the clamping assembly further comprises a movable component movably disposed on the base plate via the second driving device, and the second claw is disposed on the movable component.

6. The pick-and-place device according to claim 5, wherein the clamping assembly further comprises a first adjustment device and a second adjustment device, the first adjustment device is connected to the base plate and the first claw so as to be configured to slightly adjust a distance between the first claw and the second claw, and the second adjustment device is connected to the movable component and the second claw so as to be configured to slightly adjust the distance between the second claw and the first claw.

7. The pick-and-place device according to claim 5, wherein the second driving device comprises a driving unit, a threaded rod, two pulleys and a belt, the driving unit is disposed on the base plate, the threaded rod is screwed in the second claw, the two pulleys are respectively disposed on the driving unit and an end of the threaded rod, the belt is looped over the two pulleys, and the driving unit is configured to move the second claw toward or away from the first claw via the movable component.

8. The pick-and-place device according to claim 1, wherein the driving mechanism comprises a first movable mechanism and a second movable mechanism, the second movable mechanism is rotatably disposed on the first movable mechanism along an axis, the second movable mechanism is fixed on the base plate, the first movable mechanism is disposed on the base, and the first movable mechanism is configured to move the base plate along the axis via the second movable mechanism.

9. The pick-and-place device according to claim 1, wherein the two first driving devices each comprise a driving unit and a gear reducer that are connected to each other, and the two gear reducers are respectively connected to the two conveyor assemblies.

10. The pick-and-place device according to claim 1, further comprising a third driving device, the third driving device is disposed on the base and connected to the second side part so as to be configured to move the second side part toward or away from the first side part.

* * * * *